United States Patent [19]

Kato et al.

[11] Patent Number: 4,469,568

[45] Date of Patent: Sep. 4, 1984

[54] METHOD FOR MAKING THIN-FILM TRANSISTORS

[75] Inventors: Hiroaki Kato, Tenri; Kohhei Kishi; Yutaka Takafuji, both of Nara, all of Japan

[73] Assignees: Sharp Kabushiki Kaisha, Osaka; Japan Electronic Industry Development Association, Tokyo, both of Japan

[21] Appl. No.: 446,046

[22] Filed: Dec. 1, 1982

[30] Foreign Application Priority Data

Dec. 10, 1981 [JP] Japan .................................. 56-199894

[51] Int. Cl.³ ........................ C25D 5/44; H01L 49/02
[52] U.S. Cl. .................................... 204/35.1; 29/571; 29/591; 156/655; 204/38 A; 357/4; 357/23

[58] Field of Search ......................... 29/571, 589, 591; 156/655; 357/4, 23 TF, 23 I; 204/42, 38 A, 56 R, 35 R

[56] References Cited

PUBLICATIONS

Kallfass, T. et al., "High Voltage Thin Film Transistors ... Gate Oxide" in *Thin Solid Films*, vol. 61, No. 2, pp. 259-264, Aug. 1, 1979.

*Primary Examiner*—Aaron Weisstuch
*Assistant Examiner*—Alan E. Schiavelli
*Attorney, Agent, or Firm*—Birch, Stewart, Kolasch & Birch

[57] ABSTRACT

A method for making a thin-film transistor wherein a gate insulating layer is formed by anodizing two oxide layers on the substrate and then etching the assembly to completely remove the uppermost one of these layers to leave the lowermost layer so as to serve as the gate insulating layer.

1 Claim, 2 Drawing Figures

METHOD FOR MAKING THIN-FILM TRANSISTORS

The present invention generally relates to the art of making thin-film transistors and, more particularly, to a method for making thin-film transistors of a type wherein a gate insulating layer is employed in the form of an oxide film, particularly an oxide film formed by anodization.

The recent trend is that the application of thin-film transistors, as a switching element for use in a display device of a type using EL or liquid crystal has been studied. However, they have not yet been practically utilized because of their performance inferior to that of generally used semiconductor devices and also their low reliability.

In general, a thin-film transistor has such a construction as shown in FIG. 1. Referring to FIG. 1, reference numeral 1 represents an insulative substrate, reference numeral 2 represents a base coat, reference numeral 3 represents a gate electrode, reference numeral 4 is a gate insulating layer, reference numerals 5 and 6 represent source and drain electrodes, and reference numeral 7 represents a semiconductor layer forming a channel.

The insulative substrate 1 is generally made of ceramic or glass material. The base coat 2 is made of $SiO_2$, $Si_3N_4$ or $Ta_2O_5$ and is provided for defining a smooth support surface on the substrate 1 and also for avoiding any possible diffusion of impurity ions or any other contaminants from the substrate 1 into the region of elements. The gate electrode 3 is formed of metal such as, for example, Au, Cr, Al or Ta by means of vapour deposition. The gate insulating layer 4 is formed of, for example, SiO, $SiO_2$, $Al_2O_3$, $Ta_2O_3$ or the like, by the use of a vacuum deposition technique, a CVD technique or an anodization technique. The electrodes 5 and 6 are formed of metal such as, for example, Ni, Cr or Au by means of vapour deposition. The semiconductor layer 7 is made of a material containing, as one of its constituents, A—Si, p—Si, CdS, Te or the like, and is formed by the use of any one of vacuum deposition, ion plating, sputtering, glow-discharge method.

The thin-film transistor of the structure shown in FIG. 1 operates in a manner similar to a field-effect transistor, and a voltage applied to the gate electrode 3 is used to control the current flowing in the semiconductor layer 7 between the source and drain electrodes 5 and 6.

This type of thin-film transistor has such advantages in that, by the employment of any one of the established techniques including vacuum deposition, sputtering, CVD and the like techniques, the elements forming the transistor can readily and easily be formed on the glass substrate and in that, when applied for the manufacture of a display device, the display panel can be made large in size. However, this type of thin-film transistor has a problem left unsolved in connection with the stability, a major cause of which appears to be attributable to the gate insulating layer 4.

Of the materials for the gate insulating layer 4, an anodized layer of $Al_2O_3$, $Ta_2O_5$ or the like is frequently used because of the excellent insulative property. Especially, $Ta_2O_5$ has a relatively high specific dielectric constant as compared with that of the other dielectric materials and has excellent characteristics for an insulative material for use in the thin-film transistor.

However, even though $Ta_2O_5$ has such excellent characteristics as hereinabove described, it still has a problem. That is to say, the $Ta_2O_5$ oxide layer has therein or adjacent its surface a region in which oxygen ions are excessively present, which region is formed under the influence of oxygen ions contained in an electrolyte used during the anodization. The presence of such excessive ions tends to cause the surface or a layer adjacent the surface to exhibit a property similar to a p-type semiconductor.

At the center of the insulating layer, Ta and O are homogeneously combined stoichiometrically and, therefore, no problem exist concerning the insulativity. In view of this, when the insulative layer as whole is taken into consideration, it will be readily seen that it is essential, in order for the characteristics thereof to be stabilized, to bring stoichiometrically combined portion at the center of the insulating layer to the surface thereof thereby to increase the specific resistance and also to minimize any possible leakage of current.

In addition, although this is a defect brought about by the anodization, the oxygen ions present in the surface region and anions present in the electrolyte tend to affect the property of the semiconductor layer 7 to be subsequently formed on the insulating layer 4.

As countermeasures, it can be contemplated to remove the surface region of the insulating layer by the use of a dry etching technique. However, it has been found that the use of the dry etching technique tends to result in adhesion of foreign matters to, and roughening of, the surface of the oxide layer to such an extent that the surface will no longer be suited as an interface between it and the semiconductor layer.

Accordingly, the present invention has for its essential object to provide an improved method for making thin-film transistors having a stable gate insulating layer with minimized trap.

According to the present invention, a thin-film transistor is manufactured by forming a first metal layer, which ultimately becomes a gate electrode, on an insulative substrate, forming a second metal layer on the first metal layer, oxidizing the first and second metal layers simultaneously by the use of an anodization technique to form a first oxide layer, and a second oxide layer wholly made up of the oxide of metal for the second metal layer, and effecting a selective etching to remove only the second oxide layer thereby leaving the first oxide layer to form the gate insulating layer. It is to be noted that the selective etching of only the second oxide layer is to be understood as meaning that the first oxide layer will not be adversely affected by an etchant solution, i.e., as including selection of metals for the respective first and second layers so that the oxide of the metal for the first metal layer and that for the second metal layer have respective properties capable of being not etched off and being etched off.

This and other objects and features of the present invention will become clear from the subsequent description of the present invention made in connection with a preferred embodiment thereof with reference to the accompanying drawings, in which.

Before the description of the present invention proceeds, it is to be noted that like parts are designated by like reference numerals throughout the accompanying drawings.

Figure 1:
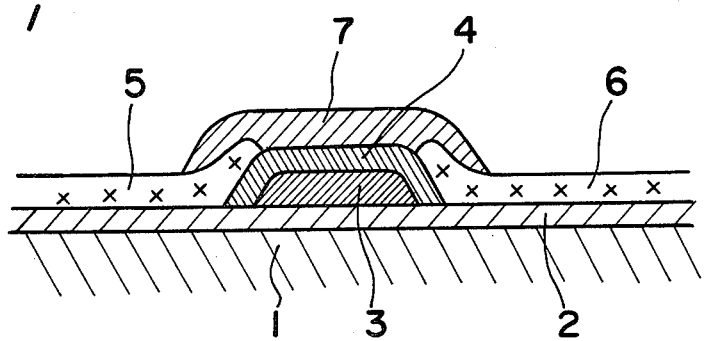
FIG. 1 is a schematic sectional view of a typical thin-film transistor.
Figure 2:
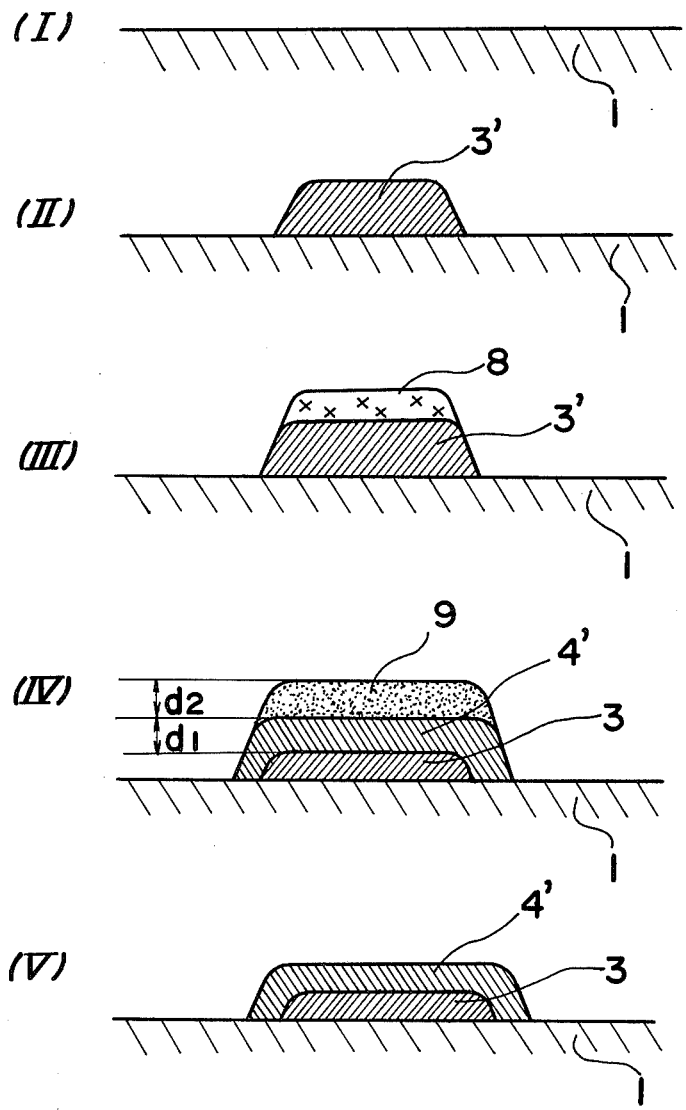
FIG. 2 illustrates the sequence of manufacturing a thin-film transistor according to the present invention.

Referring now to FIG. 2, at the initial step (I), a glass substrate 1 is prepared. After a thin base coat has been applied on one surface of the substrate 1, the subsequent step (II) is initiated to form a first layer 3' of valve metal on the base coat by the use of a metal vapor deposition technique or a sputtering technique. The valve metal for the first layer 3' so far shown is Ta. A second layer 8 of valve metal which is Nb so far shown is then formed over the first layer 3' by the use of the metal vapor deposition technique or the sputtering technique at the step (III). The film thickness of the second layer 8 is within the range of 200 to 500 ÅA. After the formation of the second layer 8, the first and second layers 3' and 8 are simultaneously processed by anodization as shown at the step (IV).

The details for the anodization are as follows. In the first place, the current is adjusted constant by the use of a current of 0.1 to 1 mA/cm$^2$. After a voltage has attained a desired value, a constant voltage electrolytic aging is carried out using the voltage drop thereof (including such voltage). The preset voltage is determined in the following manner and in the specified sequence. Since the voltage used during the electrolysis is proportional to the film thickness d, $$d_1 = k_1 \cdot V_1 \tag{1}$$

$$d_2 = k_2 \cdot V_2 \tag{2}$$

wherein $d_1$ represents the film thickness of $Ta_2O_5$, $d_2$ represents the film thickness of $Nb_2O_5$, and kn represent a proportional constant wherein $k_1$ and $k_2$ are respective proportional constants for $Ta_2O_5$ and $Nb_2O_5$. Since kn corresponds to the film thickness per volt, it can be individually determined for the type (n) of films. By way of example, $K_1 = 17(Å/V)$ and $k_2 = 22(Å/V)$.

The voltage V at the time of anodization of the first and second layers is $$V = V_1 + V_2 \tag{3}$$

and, therefore, from the equations (1) and (2), the voltage V can be expressed as follows.

$$V = (1/k_1) \cdot d_1 + (1/k_2) \cdot d_2 \tag{4}$$

In other words, once the film thickness $d_1$ and $d_2$ are given, the preset voltage V can be straightforwardly determined. In the embodiment now under discussion, since $d_1 = 1300(Å)$ and $d_2 = 500(Å)$, $$V = (1/17) \times 1300 + (1/22) \times 500 \approx 100(V)$$

At the step (V), an oxide layer 9 formed during the previous step (IV) is entirely removed. Since the oxide layer 9 is made up of $Nb_2O_5$, an alkaline solution, for example, NaOH solution, is used as an etchant to remove the layer 9. While $Nb_2O_5$ is soluble with an alkali and, therefore, the layer 9 can be removed, the layer imediately below the layer 9 is insoluble with the alkali and, therefore, the etching will teminate at the surface of a $Ta_2O_5$ layer 4'. As a result thereof, the Ta layer 3, which serves as the gate electrode, and the $Ta_2O_5$ layer 4' which is an oxide layer thereof are both left on the substrate 1. Thereafter, the assembly is flushed with water, cleaned with steam or heat-treated and is then deposited with electrode metals and semiconductor in a known manner to complete a thin-film transistor.

When the insulating layer is formed by the method according to the present invention, the excessive oxygen ions, which tend to concentrate at a portion adjacent the surface of the insulating layer according to the prior art method, and foreign matters on the surface of the insulating layer can be forced to concetrate in the $Nb_2O_5$ layer 9 which is subsequently removed completely by the use of the etching technique. (The $Nb_2O_5$ layer 9 is, in other words, used as a remover in the present invention). Therefore, the resultant gate insulating layer 4' of $Ta_2O_5$ has its surface region made of a stoichiometrically homogeneously combined composition of Ta and O. In addition, since the etching is carried out chemically, the resultant gate insulating layer 4' has a smooth surface and any possible unstability which will show up during the subsequent steps can be eliminated.

As hereinbefore fully described, since the present invention is such that, after the formation of the two layers on the substrate and the subsequent anodization of both of these two layers, only a metal oxide forming the uppermost layer is completely removed by etching, thereby leaving a metal oxide forming the lowermost layer to provide the gate insulating layer, the surface region of the gate insulating layer, especially the surface thereof which the semiconductor layer contacts, has a stoichiometrically uniform composition. Therefore, the method of the present invention is effective to form the stable gate insulating layer with minimized trap, and therefore, the characteristics of the thin-film transistor can advantageosuly be improved.

Although the present invention has been fully described in connection with the preferred embodiment thereof with reference to the accompanying drawings, it should be noted that various changes and modifications are apparent to those skilled in the art. Such changes and modifications are, unless they depart from the true scope of the present invention, to be understood as included therein.

What is claimed is:

1. A method for making a thin-film transistor which comprises the steps of forming a first metal layer of Ta, which ultimately becomes a gate electrode, on an insulative substrate, forming a second metal layer of Nb on said first metal layer, simultaneously oxidizing said first and second metal layers by the use of an anodization technique to form first and second oxide layers of $Ta_2O_5$ and $Nb_2O_5$, respectively, said first oxide layer being formed on said first layer of Ta and said second oxide layer being formed on said first oxide layer, and effecting a selective etching to remove only the second oxide layer of $Nb_2O_5$, thereby leaving the first oxide layer of $Ta_2O_5$ to form the gate insulating layer for the Ta gate electrode.

* * * * *